United States Patent [19]
Herold et al.

[11] Patent Number: 5,576,664
[45] Date of Patent: Nov. 19, 1996

[54] DISCRETE TIME DIGITAL PHASE LOCKED LOOP

[75] Inventors: Barry W. Herold, Boca Raton; Scott R. Humphreys, Boynton Beach; Phillip Johnson, Lake Worth; Raymond L. Barrett, Jr., Ft. Lauderdale; Grazyna A. Pajunen, Delray Beach, all of Fla.

[73] Assignee: Motorola, Inc., Schaumburg, Ill.

[21] Appl. No.: 556,882

[22] Filed: Nov. 2, 1995

[51] Int. Cl.$^6$ ................................. H03L 7/093
[52] U.S. Cl. .................. 331/1 A; 331/17; 331/25; 331/27; 375/376; 455/260
[58] Field of Search .................. 331/1 A, 17, 25, 331/27; 375/376; 455/260

[56] References Cited

U.S. PATENT DOCUMENTS 4,167,711  9/1979  Smoot ........................................ 331/17
5,373,255  12/1994  Bray et al. ............................... 331/1 A

OTHER PUBLICATIONS

Digital Control Systems by Kuo, B. C., pp. 278–279, Holt, Rinehart & Winston, Inc New York, 1980.

Primary Examiner—Siegfried H. Grimm
Attorney, Agent, or Firm—R. Louis Breeden

[57] ABSTRACT

A communication receiver (100) employs a discrete time digital phase locked loop (142) for maintaining a generated signal (144) locked to a reference signal (136). The discrete time digital phase locked loop (142) includes a phase detector (202), an accumulator (219), an adder (227), and a controlled oscillator (232). The accumulator (219) is connected to the phase detector (202) and a reference signal (136) for calculating an accumulator output value equal to a first sum of a current sample generated by the phase detector (202), and all of the plurality of discrete phase error samples produced prior to the current sample. The adder (227) is connected to the phase detector (202) and the accumulator (219) for forming a second sum of the current sample and the accumulator output value. The controlled oscillator (232) receives the second sum, which is utilized for controlling the controlled oscillator (232).

21 Claims, 11 Drawing Sheets

*142*

*142*

*142*

*142*

DISCRETE TIME DIGITAL PHASE LOCKED LOOP

RELATED APPLICATION

Attorney Docket No. PT00012Q, Ser. No. 08/523,665, filed Sep. 5, 1995 by Barrett et al., entitled "Method And Apparatus for Determining an Instantaneous Phase Difference Between Two Signals."

FIELD OF THE INVENTION

This invention relates in general to phase locked loops, and more specifically to a discrete time digital phase locked loop.

BACKGROUND OF THE INVENTION

Classical discrete time frequency synthesizers employ a discrete time digital phase locked loop with a hybrid of digital and analog circuits. The analog circuits typically include a phase detector, an integrator, and a voltage controlled oscillator. Sink-source-float circuits are commonly used for phase detection. Sink-source-float phase detectors and analog integrators typically employ analog components such as capacitors, resistors, current sources and the like.

Depending on system requirements, these external components may need to be specialized so that they satisfy stringent temperature invariant and low leakage requirements which are necessary for proper operation of the phase locked loop. These components are often expensive to manufacture, and more importantly, often adversely affect the manufacturing quality of communication devices utilizing them.

Discrete time digital phase locked loops also often use digital signal processors in implementing digital signal processing algorithms such as a lead-lag network filter. An approach such as this is costly, and inefficient in power consumption.

Thus, what is needed is an apparatus for providing a discrete time digital phase locked loop which is cost effective, low in power consumption, and improves manufacturing quality.

SUMMARY OF THE INVENTION

An aspect of the present invention is a discrete time digital phase locked loop for maintaining a generated signal locked to a reference signal. The discrete time digital phase locked loop comprises a discrete time digital phase error detector coupled to the reference signal and coupled to the generated signal for sequentially producing a plurality of discrete time digital phase error samples, each indicative of a phase difference between the reference signal and the generated signal, the plurality of discrete time digital phase error samples including a current sample. The discrete time digital phase locked loop also includes an accumulator coupled to the discrete time digital phase error detector and coupled to the reference signal for calculating an accumulator output value equal to a first sum of the current sample and all of the plurality of discrete time digital phase error samples produced prior to the current sample. The discrete time digital phase locked loop further includes an adder coupled to the discrete time digital phase error detector and coupled to the accumulator for forming a second sum of the current sample and the accumulator output value, and a controlled oscillator coupled to the adder for receiving the second sum, which is utilized for controlling the controlled oscillator, wherein the controlled oscillator is also coupled to the discrete time digital phase error detector for providing the generated signal thereto.

A second aspect of the present invention is a communication receiver comprising an antenna for intercepting a signal including information, a receiver element coupled to the antenna for demodulating the signal to derive the information, a processor coupled to the receiver element for processing the information, and a synthesizer coupled to the processor for producing a generated signal utilized by the communication receiver. The synthesizer comprises a reference oscillator for generating a reference signal, and a discrete time digital phase locked loop for maintaining the generated signal locked to the reference signal. The discrete time digital phase locked loop comprises a discrete time digital phase error detector coupled to the reference signal and coupled to the generated signal for sequentially producing a plurality of discrete time digital phase error samples, each indicative of a phase difference between the reference signal and the generated signal, the plurality of discrete time digital phase error samples including a current sample. The discrete time digital phase locked loop further comprises an accumulator coupled to the discrete time digital phase error detector and coupled to the reference signal for calculating an accumulator output value equal to a first sum of the current sample and all of the plurality of discrete time digital phase error samples produced prior to the current sample. The discrete time digital phase locked loop also includes an adder coupled to the discrete time digital phase error detector and coupled to the accumulator for forming a second sum of the current sample and the accumulator output value, and a controlled oscillator coupled to the adder for receiving the second sum, which is utilized for controlling the controlled oscillator. The controlled oscillator is also coupled to the discrete time digital phase error detector for providing the generated signal thereto.

DESCRIPTION OF THE PREFERRED EMBODIMENT

Figure 1:
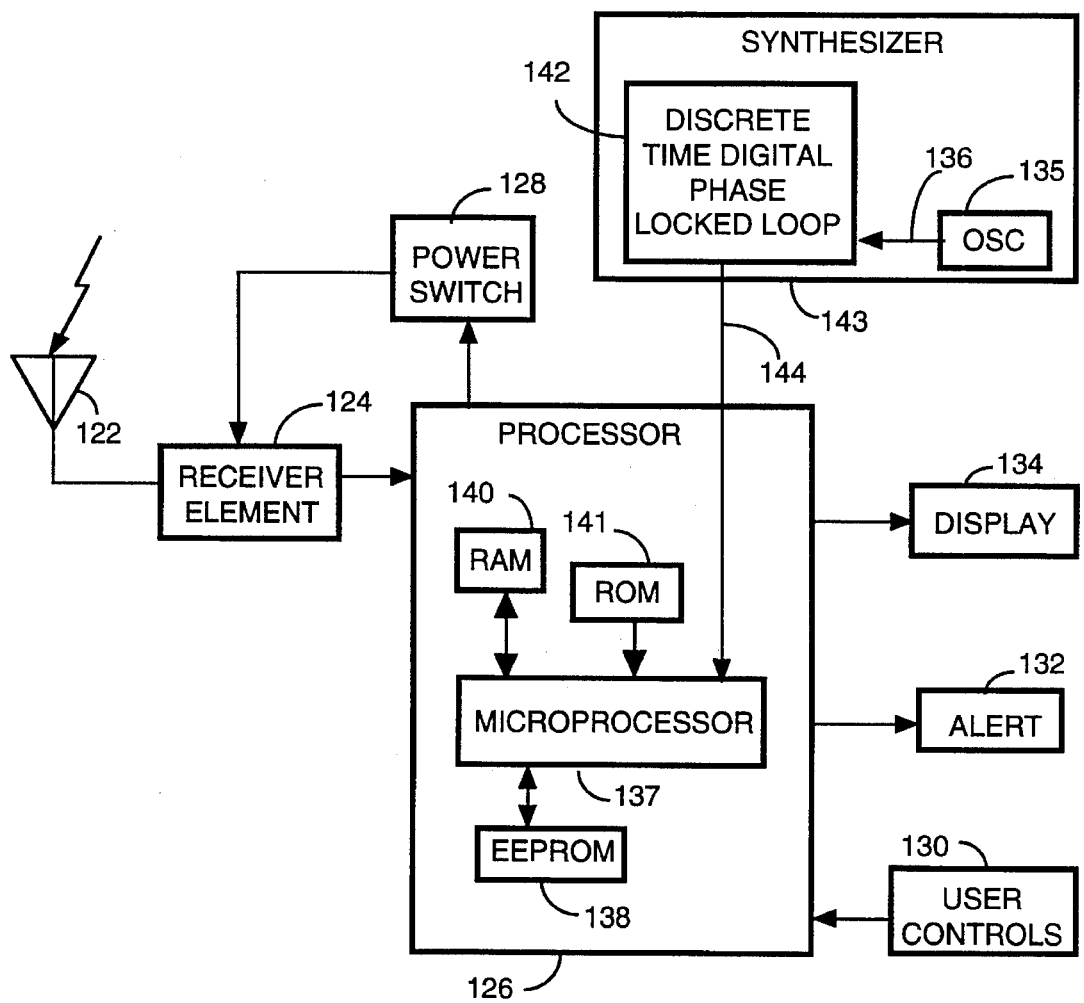
FIG. 1 is an electrical block diagram of a communication receiver in accordance with the preferred embodiment of the present invention.

FIG. 1 is an electrical block diagram of the communication receiver 100 in accordance with the preferred embodiment of the present invention. The communication receiver 100 includes a receiver antenna 122 for intercepting radio frequency (RF) signals comprising messages from a transmitting station (not shown). The receiver antenna 122 is coupled to a receiver element 124 applying conventional demodulation techniques for receiving the RF signals. Once the RF signals have been demodulated, the receiver element 124 generates demodulated message information which is presented to a processor 126 for processing. A conventional power switch 128, coupled to the processor 126, is used to control the supply of power to the receiver element 124, thereby providing a battery saving function.

To perform the necessary functions of the communication receiver 100, the processor 126 includes a microprocessor 137, a random access memory (RAM) 140, a read-only memory (ROM) 141, and an electrically erasable programmable read-only memory (EEPROM) 138.

Preferably, the microprocessor 137 is similar to the M68HC08 micro-controller manufactured by Motorola, Inc. It will be appreciated that other similar processors can be utilized for the microprocessor 137, and that additional processors of the same or alternative type can be added as required to handle the processing requirements of the processor 126. It will also be appreciated that other types of memory, e.g., EEPROM or FLASH, can be utilized for the ROM 141, as well as the RAM 140. It will be further appreciated that the RAM 140 and the ROM 141, singly or in combination, can be integrated as an integral portion of the processor 126.

The processor 126 is programmed by way of the ROM 141 to process incoming messages transmitted by the transmitting station. During message processing, the processor 126 decodes in a conventional manner an address in the demodulated message information, compares the decoded address with one or more addresses stored in the EEPROM 138, and when a match is detected, the processor 126 proceeds to process the remaining portion of the message.

Once the processor 126 has processed the message, it stores the message in the RAM 140, and a call alerting signal is generated to alert a user that a message has been received. The call alerting signal is directed to a conventional audible or tactile alerting device 132 for generating an audible or tactile call alerting signal.

The message can be accessed by the user through user controls 130, which provide functions such as lock, unlock, delete, read, etc. More specifically, by the use of appropriate functions provided by the user controls 130, the message is recovered from the RAM 140, and then conveyed to the user by way of an information interface comprising a display 134 for displaying the message, e.g., a conventional liquid crystal display (LCD).

The processor 126 is also coupled to a frequency synthesizer 143, which is utilized for clock generation of a generated signal 144 coupled to the microprocessor 137. The generated signal can be programmed to multiple frequencies, as will be discussed below. In FIG. 1 the frequency synthesizer 143 is shown as an external component to the processor 126; it will be appreciated that, alternatively, the frequency synthesizer 143 can be integrated as an integral portion of the processor 126.

The synthesizer 143 comprises a reference oscillator 135, and a discrete time digital phased locked loop 142. The reference oscillator 135 generates a reference signal 136 which is coupled to the input of the discrete time digital phase locked loop 142. The discrete time digital phase locked loop 142 is a means for maintaining the generated signal 144 locked to the reference signal 136.

Figure 2:
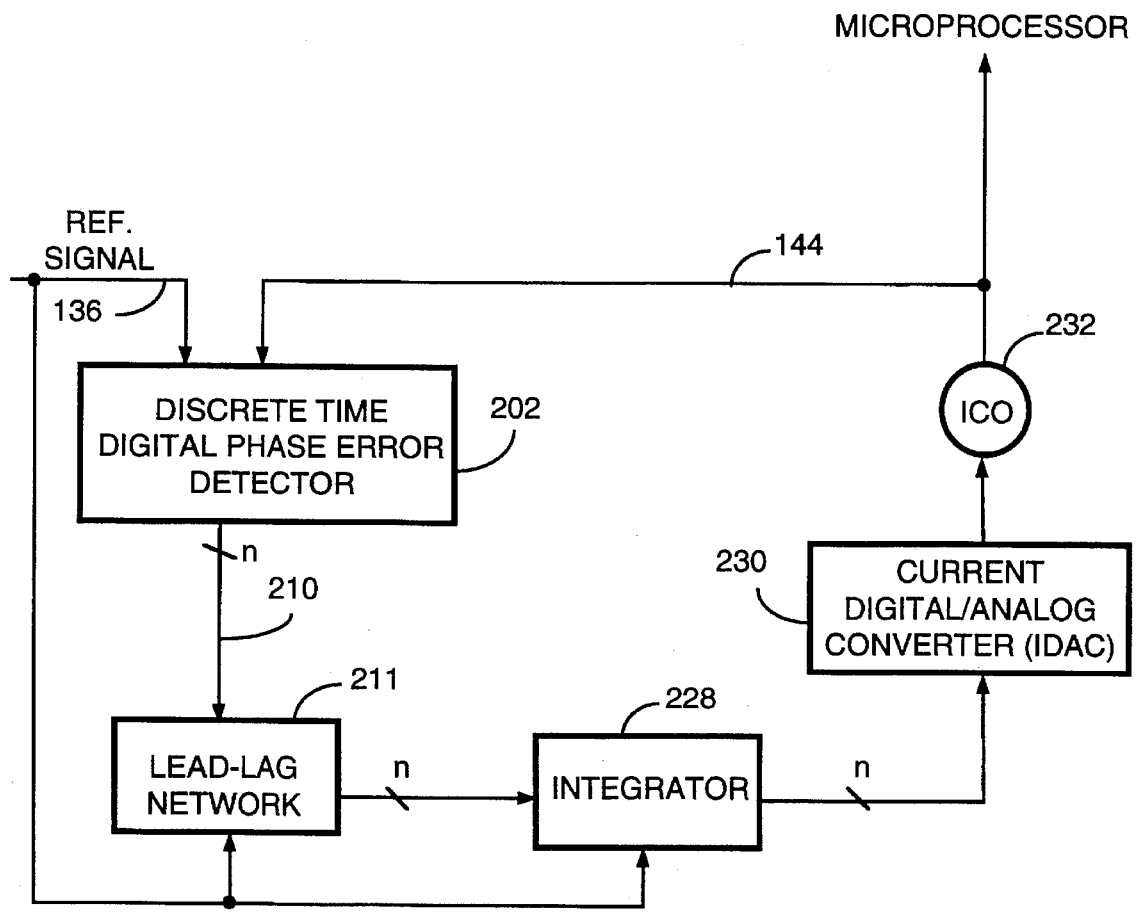
FIG. 2 is an electrical block diagram of a simplified model of the discrete time digital phase locked loop in accordance with the present invention.

FIG. 2 is an electrical block diagram of a simplified model of the discrete time digital phase locked loop 142 in accordance with the present invention. The discrete time digital phase locked loop 142 comprises a discrete time digital phase error detector 202, a discrete time lead-lag network 211, a discrete time integrator 228, a direct-current digital to analog converter (IDAC) 230, and a direct-current controlled oscillator (ICO) 232.

The inputs of the discrete time digital phase error detector 202 are coupled to the reference signal 136 and the generated signal 144 sourced by the reference oscillator 135 and the ICO 232, respectively. The output of the discrete time digital phase error detector 202 is coupled to the discrete time lead-lag network 211. The discrete time digital phase error detector 202 is preferably an instantaneous phase error detector which sequentially produces a plurality of discrete time digital phase error samples, each indicative of a phase difference between the reference signal and the generated signal. The discrete time digital phase error detector 202 generates a discrete phase error sample every clock cycle of the reference signal 136. Each discrete phase error sample is delivered to the discrete time lead-lag network 211 with a resolution of n binary bits. Every sample delivered is considered a current sample signal 210 of discrete phase error during the clock cycle execution of the reference signal 136.

The discrete time lead-lag network 211 is coupled to the reference signal 136 deriving a sampling clock for processing the discrete phase error samples generated by the discrete time digital phase error detector 202. Over a sequence of sample clocks, the discrete time lead-lag network performs discrete time filtering of the discrete phase error samples in accordance with the algorithm of a lead-lag network filter. In response, the discrete time lead-lag network 211 generates a discrete time filtered phase error sample signal with n binary bits of resolution, which is coupled to the discrete time integrator 228.

Similarly, the discrete time integrator 228 is coupled to the reference signal 136 to derive a sampling clock for processing the discrete time filtered phase error samples generated by the discrete time lead-lag network 211. In response to the sampling clock, the discrete time integrator 228 performs a long term integration of discrete time filtered phase error samples. Every clock cycle of the reference signal 136 the discrete time integrator 228 generates a discrete time integral sample with n binary bits of resolution, which is coupled to the IDAC 230.

The IDAC 230 converts discrete time integral samples to a sequence of analog control signals in the form of direct-current samples. The ICO 232 provides a means for responding to changes in the analog control signals which control the output frequency of the generated signal 144. The generated signal 144 is routed to the microprocessor 137 and to the discrete time digital phase error detector 202.

Once an analog control signal has adjusted the frequency of the generated signal 144, the generated signal 144 is then re-sampled with respect to the reference signal 136 by the discrete time digital phase error detector 202 therein producing a discrete time phase error. Once again the adjustment process begins as described above. Eventually the reference signal 136 and the generated signal 144 are phase locked, and changes in the frequency of the generated signal 144 are negligible.

Figure 3:
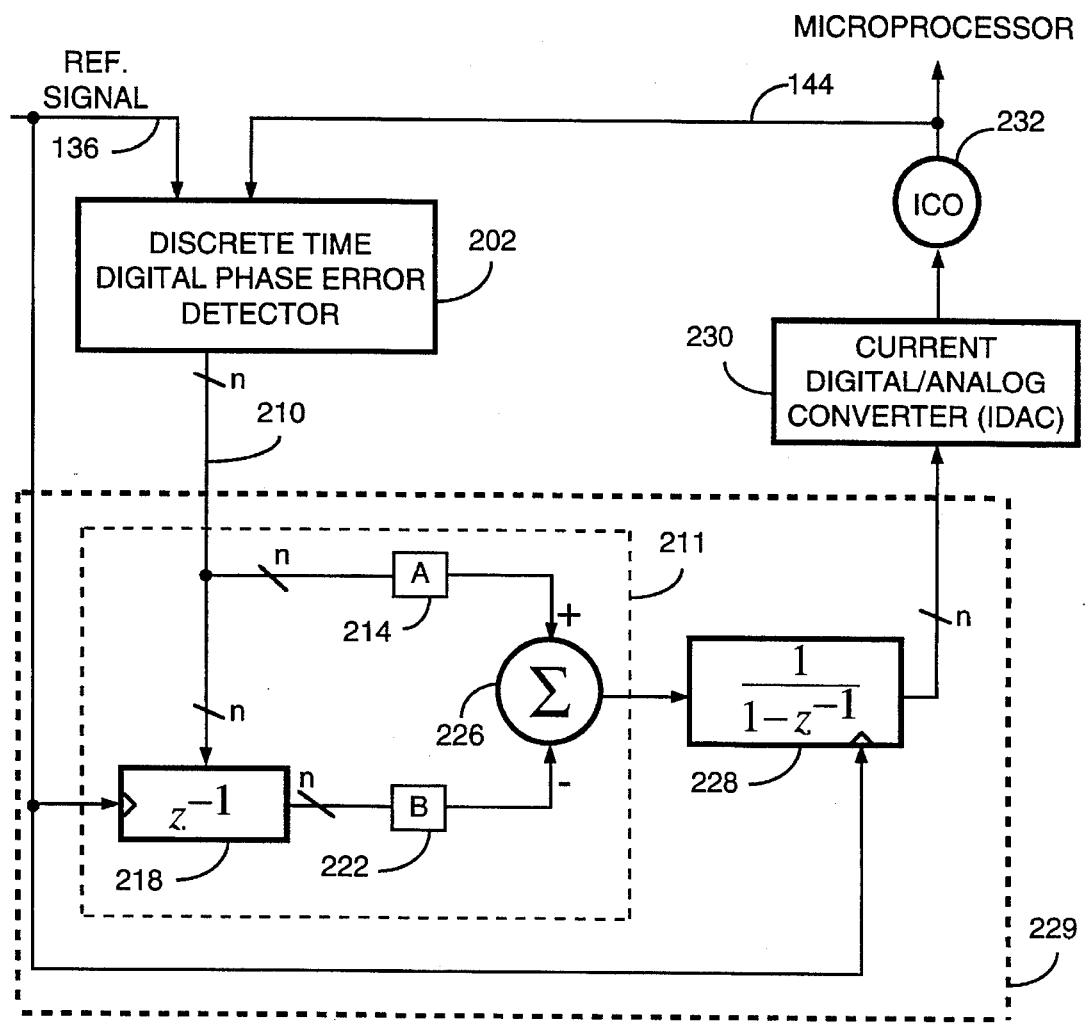
FIG. 3 is an electrical block diagram of an implementation of the discrete time digital phase locked loop in accordance with the present invention.

FIG. 3 is an electrical block diagram of an implementation of the discrete time digital phase locked loop 142 in accordance with the present invention. FIG. 3 includes the details of the discrete time lead-lag network 211, and the discrete time integrator 228.

The discrete time lead-lag network 211 implements the lead-lag network filter. The discrete time lead-lag network 211 has a discrete time transfer function which follows the expression $$H_{ll}(z) = A - Bz^{-1}.$$

The above expression was derived with the well-known bi-linear transform. It will be appreciated that, alternatively, other implementations are possible. The discrete time lead-lag network 211 comprises a first multiplier 214, a difference adder 226, a single clock delay element 218, and a second multiplier 222.

The current sample signal 210 generated by the discrete time digital phase error detector 202 is coupled to the input of the first multiplier 214 (shown as the coefficient A by way of example).

The inputs of the single clock delay element 218 are coupled to the reference signal 136 and the current sample signal 210. The output of the single clock delay element 218 is coupled to the second multiplier 222 (shown as the coefficient B by way of example). The single clock delay element 218 is implemented with a conventional edge-triggered register with a resolution of n binary bits. It derives its name from the fact that the samples received from the discrete time digital phase error detector 202 are delayed by one clock cycle of the reference signal 136 before they are delivered to the second multiplier 222.

The outputs of the first and second multipliers 214, and 222 are coupled to the difference adder 226. The difference adder 226 takes the difference between the product generated by the first multiplier 214 and the product generated by the second multiplier 222. The resultant signal is coupled to the discrete time integrator 228. The first and second multipliers 214, and 222 are implemented with conventional binary multipliers well-known in the art. The difference adder 226, similarly, is implemented with conventional binary difference adders well-known in the art.

The discrete time integrator 228 is derived from the translation of an analog continuous time integrator transfer function to a discrete time integrator transfer function which follows the expression $$H(s) = \frac{1}{s} \iff H(z) = \frac{1}{1 - z^{-1}}.$$

The above expression is derived using the well-known impulse invariant transform. It will be appreciated that, alternatively, other implementations are possible. The transforms used in developing the present invention were selected to reduce hardware complexity. The discrete integrator model is simply the model of a discrete time accumulator, as will be shown below.

The combination of the discrete time lead-lag network 211 and the discrete time integrator 228 will be referred to herein as a controller 229 (as shown in FIG. 3). The controller 229 transfer function can be expressed as $$H_c(z) = (A - Bz^{-1}) \left( \frac{1}{1 - z^{-1}} \right).$$

By applying long division the term for the discrete time integrator 228 can be rewritten as $$\frac{1}{1 - z^{-1}} = 1 + \sum_{i=1}^{\infty} z^{-i} = \sum_{i=0}^{\infty} Z^{-i} = Z^0 + Z^{-1} + Z^{-2} + \ldots$$

Multiplying this expression with the expression for the discrete time lead-lag network 211 results in the expression $$Az^0 - Bz^{-1} + Az^{-1}Bz^{-2} + \ldots$$

Regrouping terms gives the result $$Az^0 + (A-B)z^{-1} + (A-B)z^{-2} + \ldots$$

This expression can be reduced to $$H_c(z) = Az^0 + (A - B) \sum_{i=1}^{\infty} z^{-i}.$$

Regrouping the terms and changing to an accumulator with no delay yields $$H_c(z) = Bz^0 + (A - B) \sum_{i=0}^{\infty} z^{-i},$$

or equivalently $$H_c(z) = B + (A - B) \left( \frac{1}{1 - z^{-1}} \right).$$

Figure 4:
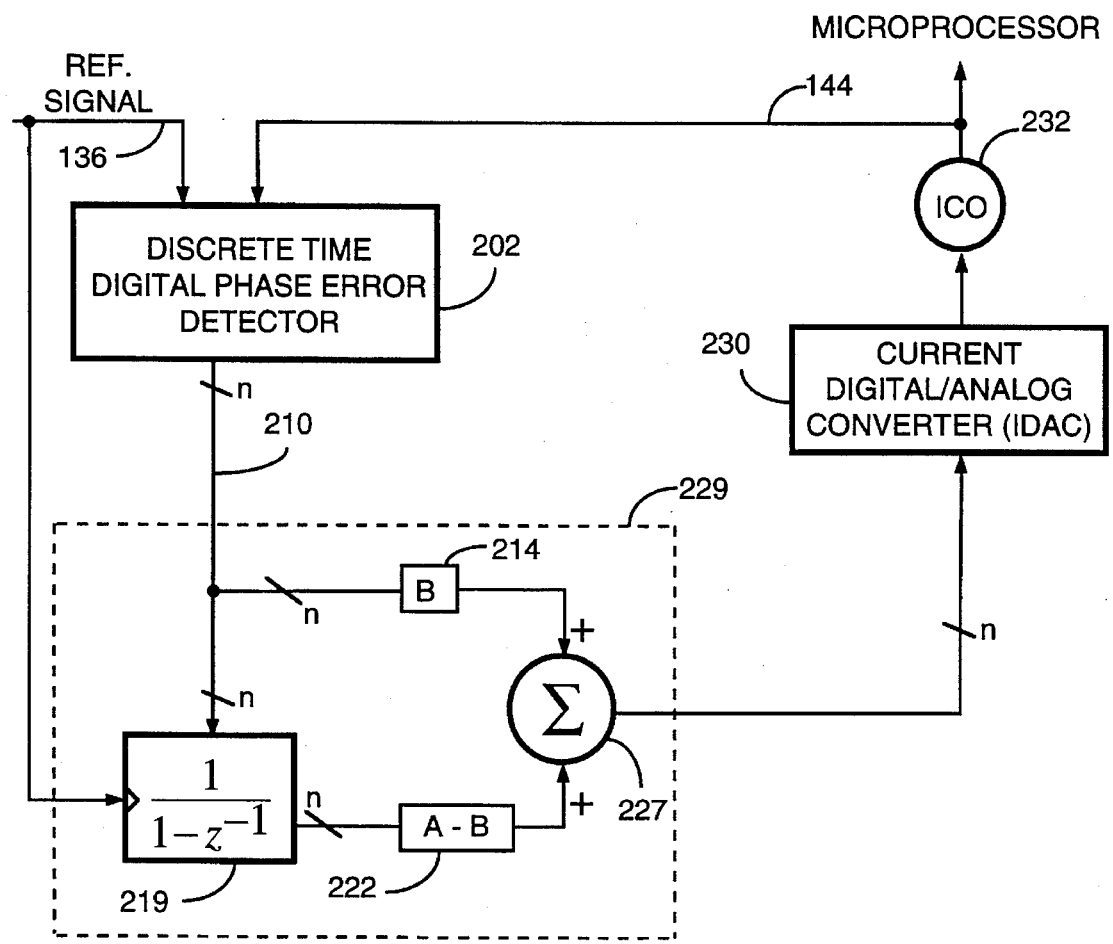
FIG. 4 is an electrical block diagram of a first embodiment of the discrete time digital phase locked loop in accordance with the present invention.

Restructuring the controller 229 to fit this expression results in the electrical block diagram of FIG. 4. FIG. 4 represents an electrical block diagram of a first embodiment of the discrete time digital phase locked loop 142 in accordance with the present invention.

The coupling of the elements of the controller 229 remains the same except for the removal of the discrete time integrator 228 which is now replaced with a signal wire. The elements of the controller 229 of this embodiment, however, are different from those described in the controller 229 of FIG. 3. First as mentioned above, the discrete time integrator 228 has been removed. Second, the single clock delay element 218 of FIG. 3 has been replaced with an accumulator 219. Third, the first and second multipliers 214, 222 of FIG. 3 have different coefficients, B and A–B, respectively. The first multiplier 214 is for multiplying the current sample signal 210 by a predetermined constant (in this case, the coefficient B). The second multiplier 222 is for multiplying the output of the accumulator 219 by a predetermined constant (in this case, the coefficient A–B). And finally, the difference adder 226 of FIG. 3 has been replaced with a digital summing adder 227. These changes have effectively reduced the amount of circuitry of FIG. 3 by the elimination of the discrete time integrator 228. It will be appreciated that, alternatively, the predetermined constants A and B can be adjusted by the microprocessor 137 or another controller in response to to the phase error in order to modify the lock speed and stability of the phase locked loop 142.

The digital summing adder 227 is a conventional binary adder with resolution of n binary bits. Thus, the only difference between the difference adder 226 and the digital summing adder 227 is that the latter adds both arguments where the former takes the difference.

The signal generated by the accumulator 219 is a value equal to a first sum of the current sample signal 210 stored and all of the plurality of discrete time digital phase error samples produced prior to the current sample signal 210. The current sample signal 210 and the first sum are multiplied by the coefficients of the first and second multiplier 214, 222, respectively. The digital summing adder 227 is a means for adding the products, thereby generating a second sum having a resolution of n binary bits. The second sum is processed by the IDAC 230 to produce an analog control signal. The ICO 232 in response will adjust the frequency of the generated signal 144, as described above.

Note the transfer function of the controller 229 has not been changed. Simply put, the terms of the transfer function have been regrouped in a manner which simplifies the circuit implementation of the controller 229 of FIG. 3.

Further simplification can be obtained depending on the choice of coefficients for the first and second multipliers 214, and 222. The fastest lock time may be achieved when placing the zero and pole frequencies geometrically-symmetric to each other on either side of the unity gain frequency. Working through the bilinear transform by applying the translation $$s = C \frac{1-z^{-1}}{1+z^{-1}}$$

to an analog lead-lag filter gives the result $$H_{ll}(s) = \frac{\frac{s}{\omega_z}+1}{\frac{s}{\omega_p}+1} \Longleftrightarrow H_{ll}(z) = \frac{\left(1+\frac{C}{\omega_z}\right)+\left(1-\frac{C}{\omega_z}\right)z^{-1}}{\left(1+\frac{C}{\omega_p}\right)+\left(1-\frac{C}{\omega_p}\right)z^{-1}}$$

where $\omega_z$ is the frequency term for the zero, and $\omega_p$ is the frequency term for the pole, and C is a constant. Letting $\omega_{0\,dB}$ equal the gain bandwidth frequency, and also letting $$X = \frac{\omega_{0dB}}{\omega_z} = \frac{\omega_p}{\omega_{0dB}}$$

gives the result $$H_{ll}(z) = \frac{\left(1+\frac{CX}{\omega_{0dB}}\right)+\left(1-\frac{CX}{\omega_{0dB}}\right)z^{-1}}{\left(1+\frac{C}{X\omega_{0dB}}\right)+\left(1-\frac{C}{X\omega_{0dB}}\right)z^{-1}}.$$

Substituting $C = X \cdot \omega_{0\,dB}$ results in the expression $$H_{ll}(z) = \frac{(1+X^2)+(1-X^2)z^{-1}}{2}.$$

Recalling the transfer function of the discrete time lead-lag network 211 of FIG. 3

$$H_{ll}(z) = A - Bz^{-1},$$

reveals that $$A = \frac{1+X^2}{2} \text{ and } B = \frac{X^2-1}{2}$$

if the pole is moved to infinity. It can also be shown that $A-B=1$. Therefore, the expression for the controller 229 of FIG. 4

$$H_C(z) = B + (A-B)\left(\frac{1}{1-z^{-1}}\right)$$

can be rewritten as $$H_C(z) = B + \left(\frac{1}{1-z^{-1}}\right).$$

Figure 5:
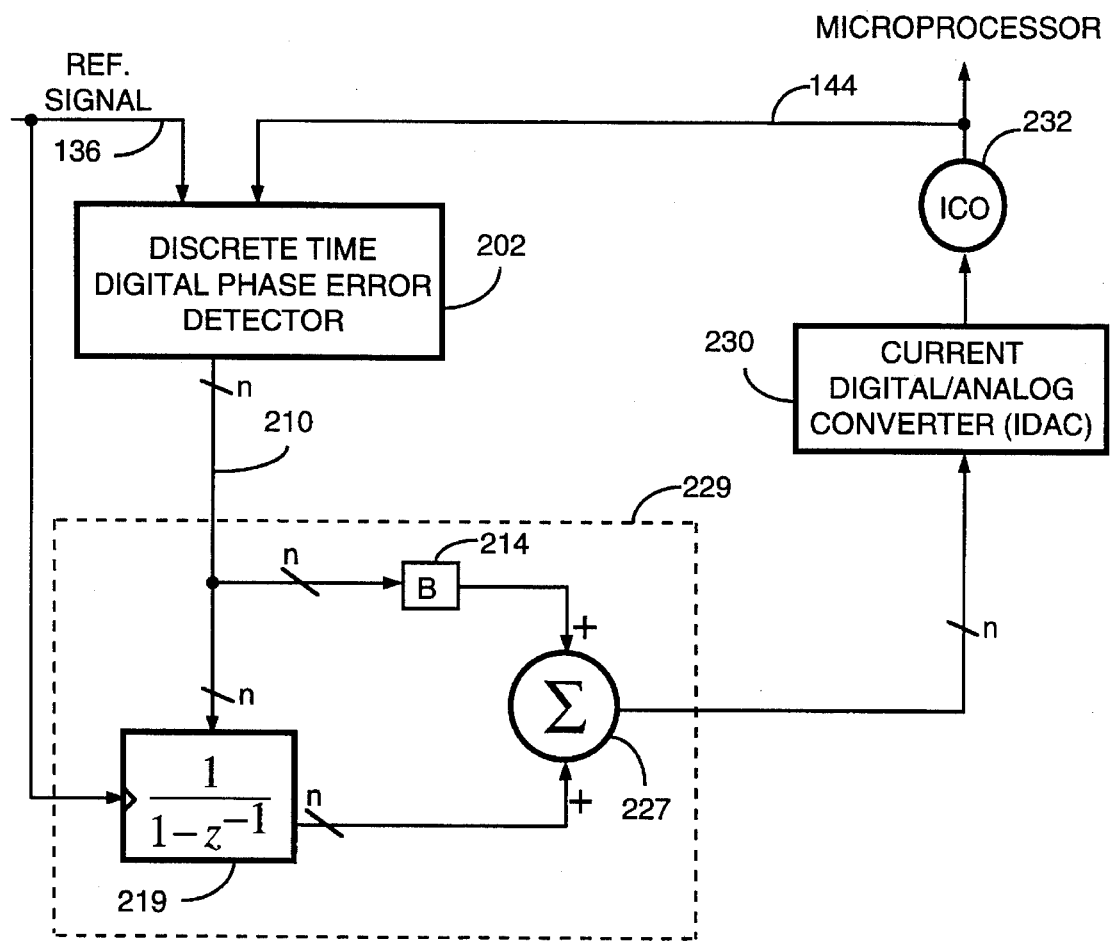
FIG. 5 is an electrical block diagram of a second embodiment of the discrete time digital phase locked loop in accordance with the present invention.

This expression leads to the controller 229 of FIG. 5, which is an electrical block diagram of a second embodiment of the discrete time digital phase locked loop 142 in accordance with the present invention. The lack of the additional pole is not a great concern for the operation of the controller 229, as its primary purpose is to filter spurious frequencies from the reference signal 136. The controller 229 of FIG. 5 has been optimized for frequency lock time by utilizing the expression $$X = \frac{\omega_{0dB}}{\omega_z} = \frac{\omega_p}{\omega_{0dB}}$$

defined above. This relationship reduces the transfer function of the controller 229 by removing the second multiplier element 222 therein further simplifying the controller 229 circuitry.

By letting B=1, the first multiplier 214 can also be eliminated. Using Jury's Test for Stability (see Kuo, B. C., "Digital Control Systems", Holt, Rinehart and Winston, Inc., New York, 1980, pp. 278–279), as is well-known by one of ordinary skill in the art, it can be shown that the discrete time digital phase locked loop 142 remains stable when changing the coefficient B to unity.

Figure 6:
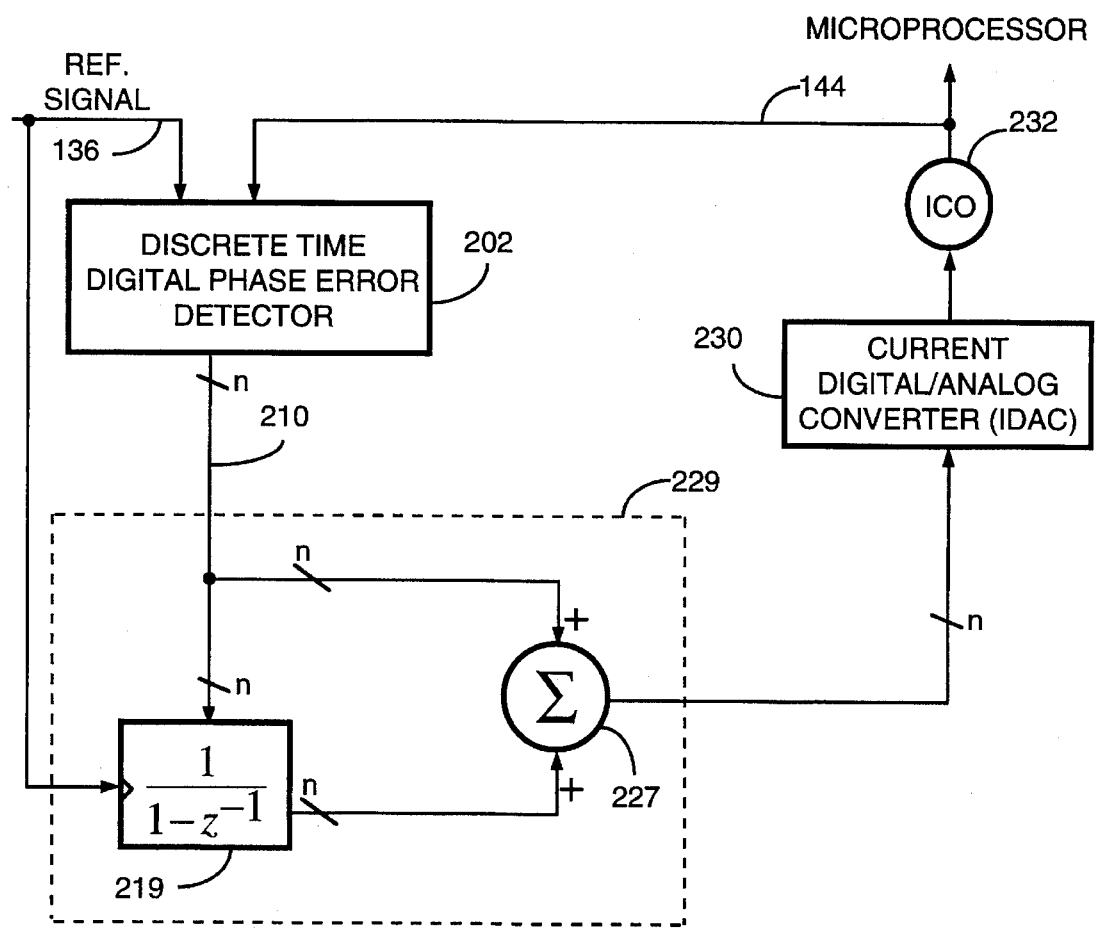
FIG. 6 is an electrical block diagram of a third embodiment of the discrete time digital phase locked loop in accordance with the present invention.

The elimination of the first multiplier 214 leads to the controller 229 of FIG. 6, which is an electrical block diagram of a third embodiment of the discrete time digital phase locked loop 142 in accordance with the present invention. This embodiment includes the least amount of circuitry from the other two embodiments described above, and is the preferred embodiment of the present invention.

Figure 7:
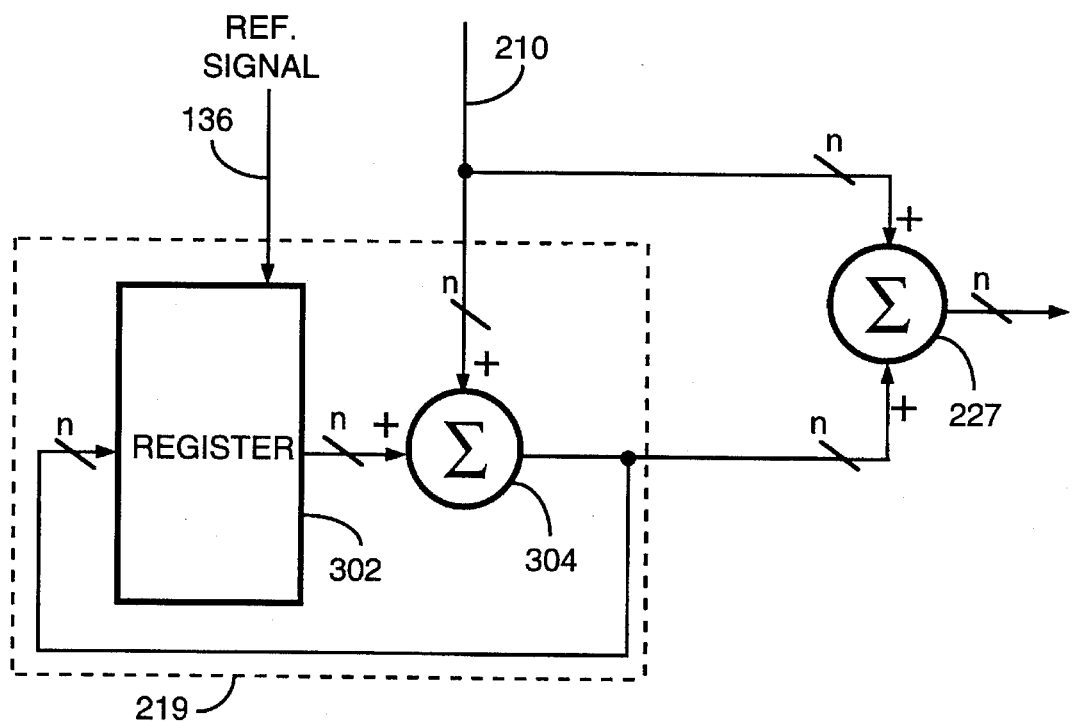
FIG. 7 is an electrical block diagram which illustrates the implementation of a controller in accordance with the preferred embodiment of the present invention.

FIG. 7 is an electrical block diagram which illustrates the implementation of the controller 229 of FIG. 6 in accordance with the preferred embodiment of the present invention. The signal generated by the accumulator 219 forms an accumulator output value equal to a first sum generated by the digital summer 304 which is the result of the addition of the current sample signal 210 and all of the plurality of discrete time digital phase error samples produced prior to the current sample signal 210. The first sum and the current sample signal 210 are then added together by the digital summing adder 227 thereby generating a second sum having a resolution of n binary bits.

Figure 8:
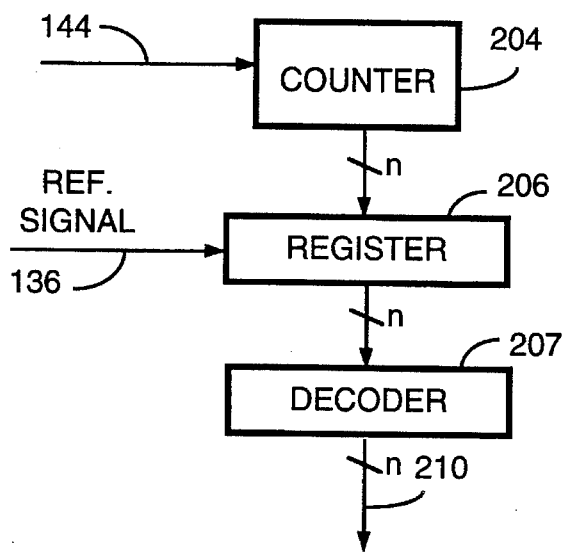
FIG. 8 is an electrical block diagram of a discrete time digital phase error detector in accordance with the preferred embodiment of the present invention.

FIG. 8 is an electrical block diagram of the discrete time digital phase error detector 202 in accordance with the preferred embodiment of the present invention. The discrete time digital phase error detector 202 comprises a counter 204, a conventional edge-triggered register 206, and a decoder 207. The counter 204 is coupled to the generated signal 144 for counting the clock cycles of the ICO 232. The counter 204 is preferably implemented as a Johnson Counter, well-known to one of ordinary skill in the art. The input of the register 206 is coupled to the output of the counter 204 for recording a count held by the counter 204 concurrent with a predetermined transition of the reference signal 136.

The concurrent event of recording the count held by the counter 204 at the predetermined transition of the reference signal 136 results in the recording of an instantaneous phase sample. The phase sample is accurate within a single bit of uncertainty.

The decoder 207 is introduced to decode the sequence generated by the counter 204 using the Johnson Counter code. The decoder 207 is implemented with conventional combinatorial techniques which translate the pseudo-random data sequence to a linear sequence as required for the operation of the controller 229. Once the recorded signal has been decoded, the decoder 207 generates the current sample signal 210.

Figure 9:
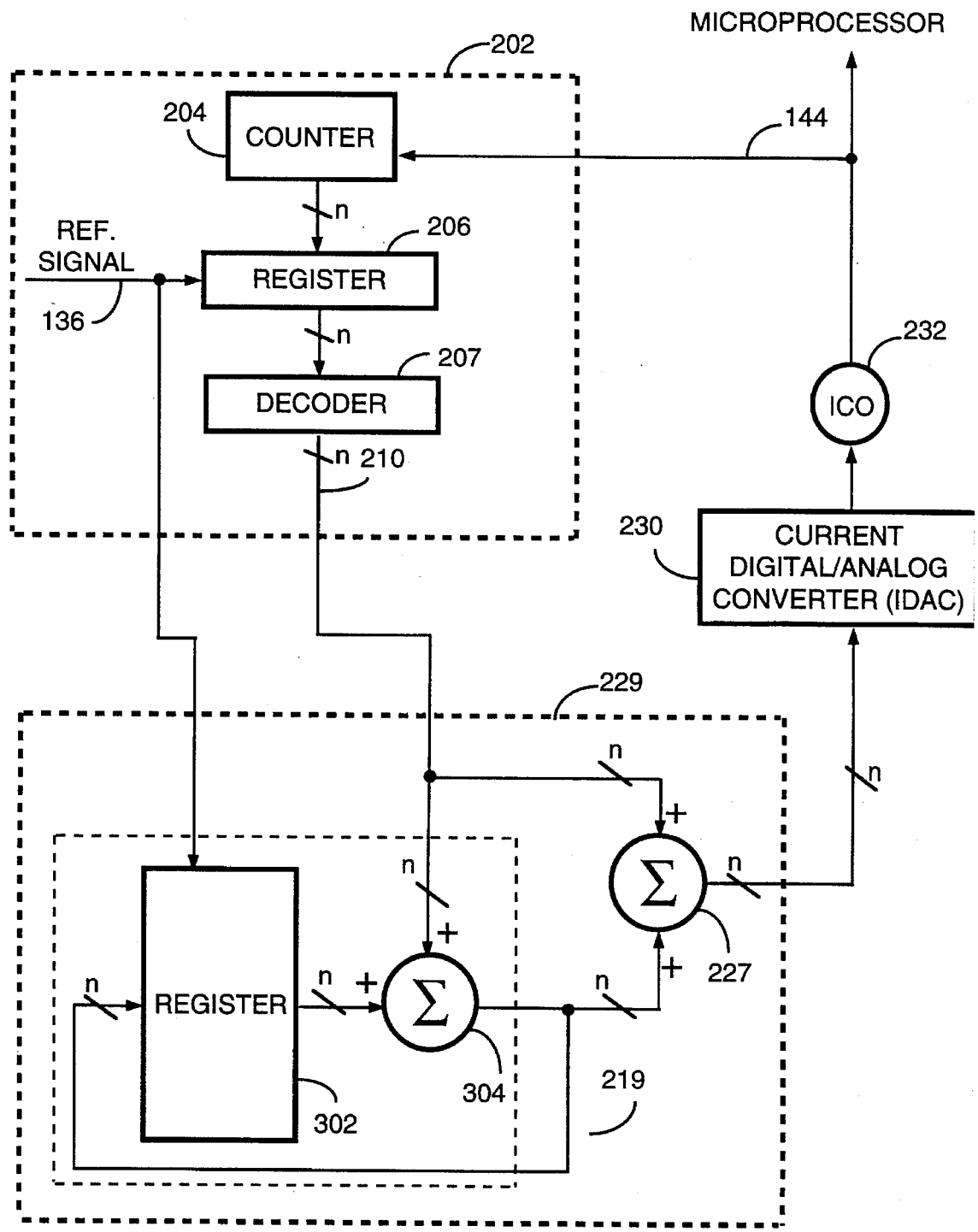
FIG. 9 is an electrical block diagram detailing the implementation of the third embodiment of the discrete time digital phase locked loop in accordance with the present invention.

FIG. 9 is an electrical block diagram detailing the implementation of the third embodiment of the discrete time digital phase locked loop 142 described above in accordance with the present invention.

Figure 10:
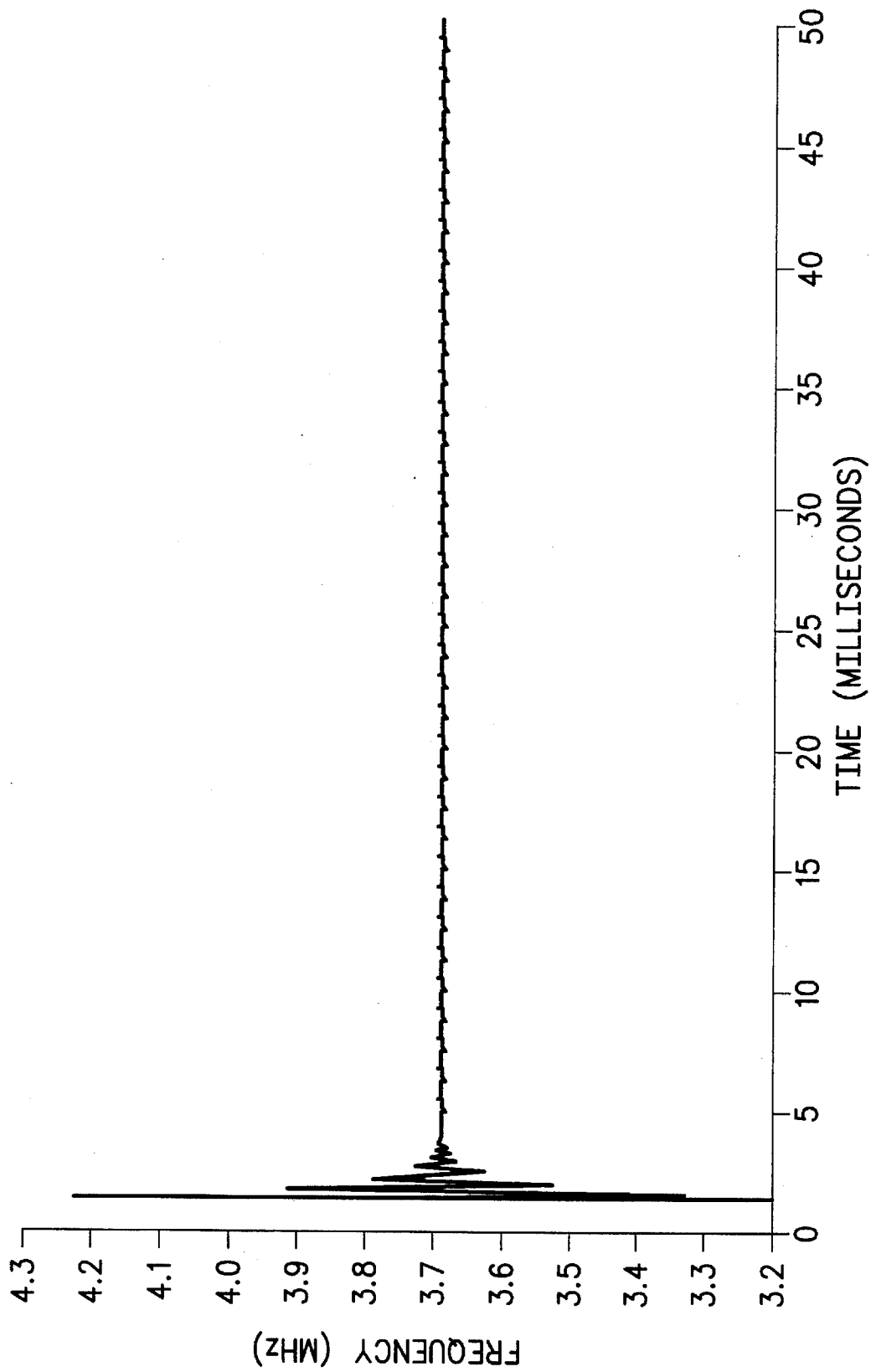
FIG. 10 depicts results of a simulation illustrating the step response of the third embodiment of the discrete time digital phase locked loop.

FIG. 10 depicts results of a simulation illustrating the step response of the third embodiment of the discrete time digital phase locked loop 142. FIG. 10 plots the frequency of the ICO 232 versus time for a frequency step of 500 kHz. As can be seen, there is jitter after the discrete time digital phase locked loop 142 has locked. This is due to the discrete phase measurements made in the discrete time digital phase error detector 202.

Figure 11:
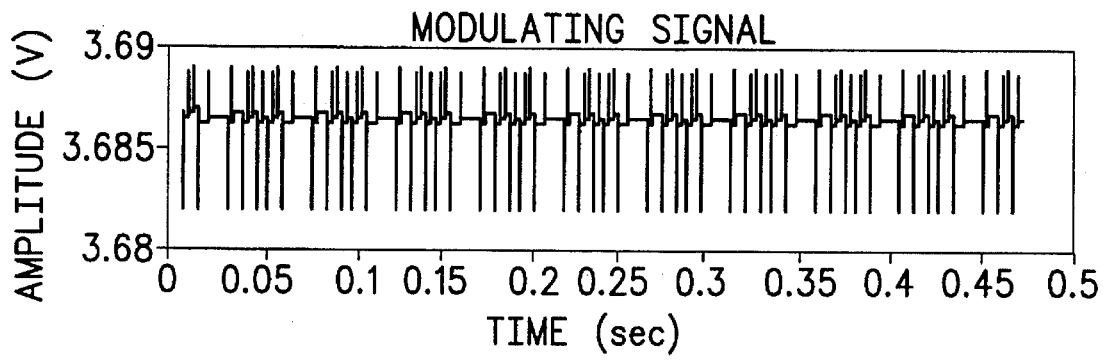
FIGS. 11–15 depict results of simulations illustrating the magnitude and phase response of the third embodiment of the discrete time digital phase locked loop.
Figure 12:
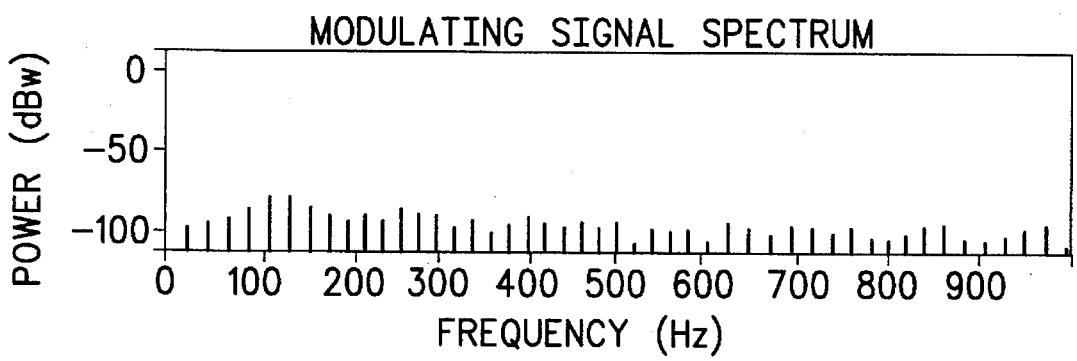
Figure 13:
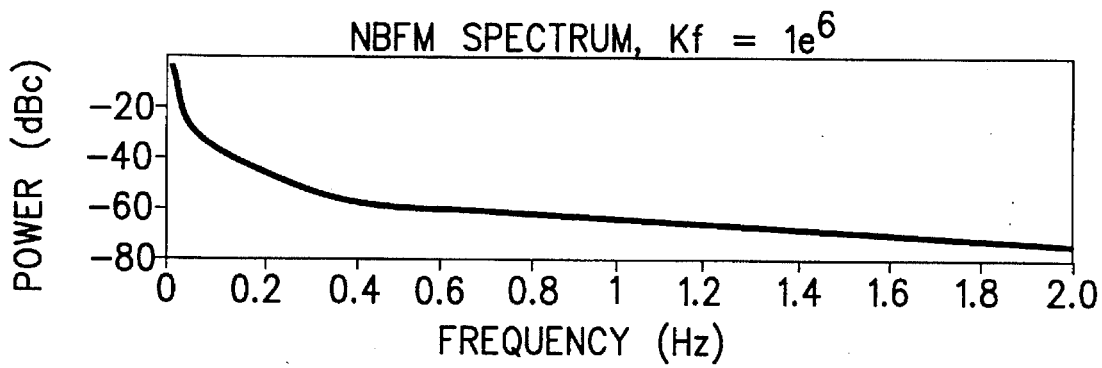
Figure 14:
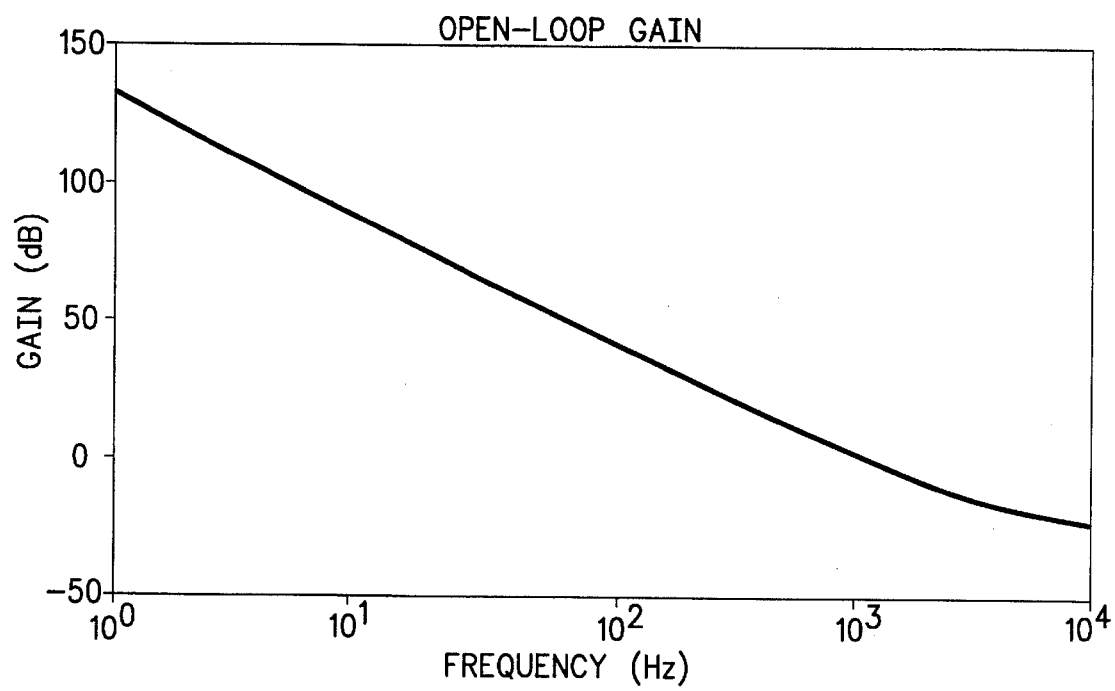
Figure 15:
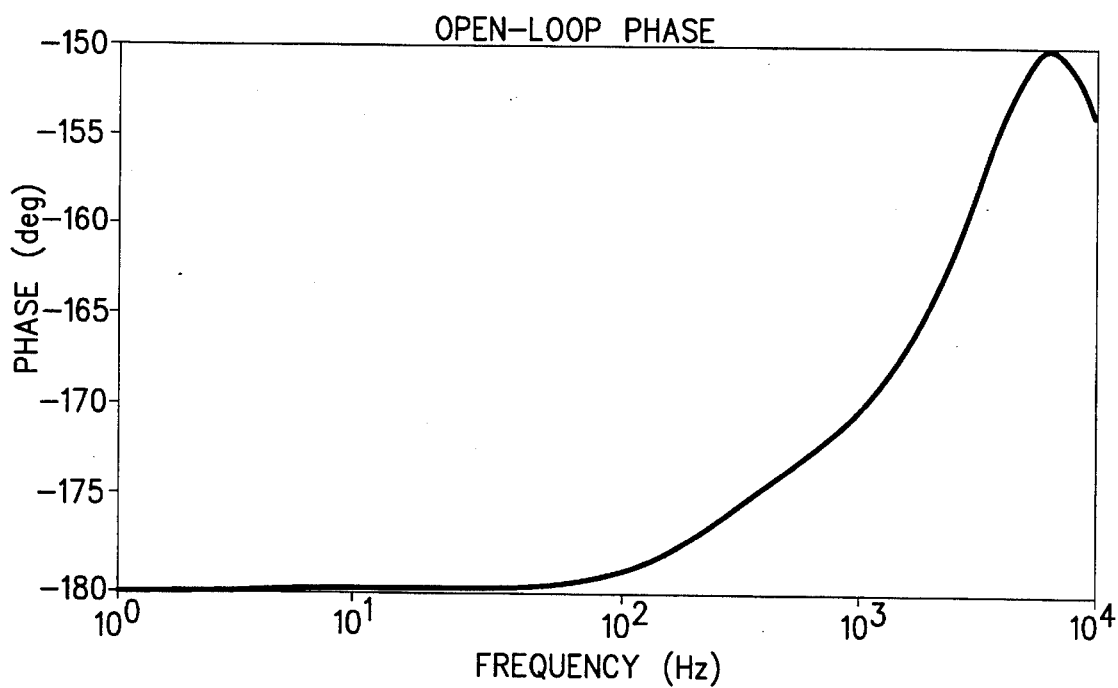

Analysis indicates that jitter sideband noise is below −60 dBc beyond 10 kHz as shown in FIGS. 11–13. The open-loop gain and phase response of the loop is shown in FIGS. 14 and 15. This loop has a 15 to 20 degree phase margin. It can be noted that if the frequency of the reference signal 136 changes, the phase margin will not change. Therefore, the controller 229 advantageously does not need to be modified for different reference frequencies of the reference oscillator 135. This result is in contrast to conventional charge-pump based phase locked loops where the loop filter would need to be modified after a reference frequency change.

Thus, it should be apparent by now that the present invention provides a discrete time digital phase locked loop 142 that is cost effective, low in power consumption, and less affected by manufacturing variations. The present invention eliminates all external components which would ordinarily be used in a classical design of a digital phase locked loop. In particular, the third embodiment of the discrete time digital phase locked loop 142 eliminates two multipliers and a register included in the embodiment depicted in FIG. 3. This represents a significant reduction in integrated circuit die area, cost, and power consumption. Furthermore, because a large portion of this circuitry is digital, the system has a reduced dependence on voltage, temperature and process variations encountered in a wafer fabrication process. The elimination of one or more integration capacitors permits using the depicted embodiments of the discrete time digital phase locked loop 142 in a wafer fabrication process with poor capacitor structures, and eliminates the need for external filter capacitors, which can be required in some prior art implementations. Finally, the elements of the depicted embodiments of the discrete time digital phase locked loop 142 are independent of the reference frequency of the reference oscillator 135. This increases the flexibility of the phase locked loop according to the present invention over that of more traditional architectures.

What is claimed is:

1. A discrete time digital phase locked loop for maintaining a generated signal locked to a reference signal, the discrete time digital phase locked loop comprising:

a discrete time digital phase error detector coupled to the reference signal and coupled to the generated signal for sequentially producing a plurality of discrete time digital phase error samples, each indicative of a phase difference between the reference signal and the generated signal, the plurality of discrete time digital phase error samples including a current sample;

an accumulator coupled to the discrete time digital phase error detector and coupled to the reference signal for calculating an accumulator output value equal to a first sum of the current sample and all of the plurality of discrete time digital phase error samples produced prior to the current sample;

an adder coupled to the discrete time digital phase error detector and coupled to the accumulator for forming a second sum of the current sample and the accumulator output value; and a controlled oscillator coupled to the adder for receiving the second sum, which is utilized for controlling the controlled oscillator, wherein the controlled oscillator is also coupled to the discrete time digital phase error detector for providing the generated signal thereto.

2. The discrete time digital phase locked loop of claim 1, wherein the adder is a digital adder, and wherein the discrete time digital phase locked loop further comprises a digital/analog converter (DAC) coupled to the adder for converting the second sum to an analog control signal, and coupled to the controlled oscillator for delivering the analog control signal thereto.

3. The discrete time digital phase locked loop of claim 1, wherein the discrete time digital phase error detector is an instantaneous phase error detector.

4. The discrete time digital phase locked loop of claim 1, further comprising a multiplier coupled to the discrete time digital phase error detector and coupled to the adder for multiplying the current sample by a predetermined constant.

5. The discrete time digital phase locked loop of claim 1, further comprising a multiplier coupled to the accumulator and coupled to the adder for multiplying the accumulator output value by a predetermined constant.

6. The discrete time digital phase locked loop of claim 1, wherein the discrete time digital phase error detector comprises:

a counter coupled to the controlled oscillator for counting the generated signal; and a register coupled to the counter and coupled to the reference signal for recording a count held by the counter concurrent with a predetermined transition of the reference signal.

7. The discrete time digital phase locked loop of claim 6, wherein the discrete time digital phase error detector further comprises a decoder coupled to the register for generating one of the plurality of discrete time digital phase error samples from the count.

8. A discrete time digital phase locked loop for maintaining a generated signal locked to a reference signal, the discrete time digital phase locked loop comprising:

discrete time digital phase error detector means coupled to the reference signal and coupled to the generated signal for sequentially producing a plurality of discrete time digital phase error samples, each indicative of a phase difference between the reference signal and the generated signal, the plurality of discrete time digital phase error samples including a current sample;

accumulator means coupled to the discrete time digital phase error detector means and coupled to the reference signal for calculating an accumulator output value equal to a first sum of the current sample and all of the plurality of discrete time digital phase error samples produced prior to the current sample;

adder means coupled to the discrete time digital phase error detector means and coupled to the accumulator means for forming a second sum of the current sample and the accumulator output value; and controlled oscillator means coupled to the adder means for receiving the second sum, which is utilized for controlling the controlled oscillator means, wherein the controlled oscillator means is also coupled to the discrete time digital phase error detector means for providing the generated signal thereto.

9. The discrete time digital phase locked loop of claim 8, wherein the adder means is a digital adder means, and wherein the discrete time digital phase locked loop further comprises a digital/analog converter (DAC) means coupled to the adder means for converting the second sum to an analog control signal, and coupled to the controlled oscillator means for delivering the analog control signal thereto.

10. The discrete time digital phase locked loop of claim 8, wherein the discrete time digital phase error detector means is an instantaneous phase error detector means.

11. The discrete time digital phase locked loop of claim 8, further comprising multiplier means coupled to the discrete time digital phase error detector means and coupled to the adder means for multiplying the current sample by a predetermined constant.

12. The discrete time digital phase locked loop of claim 8, further comprising multiplier means coupled to the accumulator means and coupled to the adder means for multiplying the accumulator output value by a predetermined constant.

13. The discrete time digital phase locked loop of claim 8, wherein the discrete time digital phase error detector means comprises:

counter means coupled to the controlled oscillator means for counting the generated signal; and register means coupled to the counter means and coupled to the reference signal for recording a count held by the counter means concurrent with a predetermined transition of the reference signal.

14. The discrete time digital phase locked loop of claim 13, wherein the discrete time digital phase error detector means further comprises decoder means coupled to the register means for generating one of the plurality of discrete time digital phase error samples from the count.

15. A communication receiver, comprising:

an antenna for intercepting a signal including information;

a receiver element coupled to the antenna for demodulating the signal to derive the information;

a processor coupled to the receiver element for processing the information;

a synthesizer coupled to the processor for producing a generated signal utilized by the communication receiver, the synthesizer comprising:

a reference oscillator for generating a reference signal; and a discrete time digital phase locked loop for maintaining the generated signal locked to the reference signal, the discrete time digital phase locked loop comprising:

a discrete time digital phase error detector coupled to the reference signal and coupled to the generated signal for sequentially producing a plurality of discrete time digital phase error samples, each indicative of a phase difference between the reference signal and the generated signal, the plurality of discrete time digital phase error samples including a current sample;

an accumulator coupled to the discrete time digital phase error detector and coupled to the reference signal for calculating an accumulator output value equal to a first sum of the current sample and all of the plurality of discrete time digital phase error samples produced prior to the current sample;

an adder coupled to the discrete time digital phase error detector and coupled to the accumulator for forming a second sum of the current sample and the accumulator output value; and a controlled oscillator coupled to the adder for receiving the second sum, which is utilized for controlling the controlled oscillator, wherein the controlled oscillator is also coupled to the discrete time digital phase error detector for providing the generated signal thereto.

16. The communication receiver of claim 15, wherein the adder is a digital adder, and wherein the discrete time digital phase locked loop further comprises a digital/analog converter (DAC) coupled to the adder for converting the second sum to an analog control signal, and coupled to the controlled oscillator for delivering the analog control signal thereto.

17. The communication receiver of claim 15, wherein the discrete time digital phase error detector is an instantaneous phase error detector.

18. The communication receiver of claim 15, further comprising a multiplier coupled to the discrete-time digital phase error detector and coupled to the adder for multiplying the current sample by a predetermined constant.

19. The communication receiver of claim 15, further comprising a multiplier coupled to the accumulator and coupled to the adder for multiplying the accumulator output value by a predetermined constant.

20. The communication receiver of claim 15, wherein the discrete time digital phase error detector comprises:

a counter coupled to the controlled oscillator for counting the generated signal; and a register coupled to the counter and coupled to the reference signal for recording a count held by the counter concurrent with a predetermined transition of the reference signal.

21. The communication receiver of claim 20, wherein the discrete time digital phase error detector further comprises a decoder coupled to the register for generating one of the plurality of discrete time digital phase error samples from the count.

* * * * *